United States Patent
Doany et al.

(10) Patent No.: US 8,601,677 B2
(45) Date of Patent: Dec. 10, 2013

(54) OPTICAL ALIGNMENT MODULE UTILIZING TRANSPARENT RETICLE TO FACILITATE TOOL CALIBRATION DURING HIGH TEMPERATURE PROCESS

(75) Inventors: Fuad E. Doany, Katonah, NY (US); Andrew D. Perez, Peekskill, NY (US); Niranjana Ruiz, Somers, NY (US); Lavanya Turlapati, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/410,853

(22) Filed: Mar. 2, 2012

(65) Prior Publication Data

US 2012/0159782 A1 Jun. 28, 2012

Related U.S. Application Data

(62) Division of application No. 12/623,836, filed on Nov. 23, 2009, now Pat. No. 8,176,624.

(51) Int. Cl.
*B23F 19/00* (2006.01)
(52) U.S. Cl.
USPC ............ 29/740; 29/720; 29/721; 29/833; 29/834; 438/107
(58) Field of Classification Search
USPC ............ 29/729, 739, 720–721, 832–834; 438/106–125
See application file for complete search history.

(56) References Cited

U.S. PATENT DOCUMENTS

| | | | |
|---|---|---|---|
| 4,404,741 A * | 9/1983 | Lebet et al. ............... | 29/721 |
| 4,956,911 A | 9/1990 | Zaremba et al. | |
| 5,022,580 A | 6/1991 | Pedder | |
| 5,359,768 A | 11/1994 | Haley | |
| 5,500,605 A | 3/1996 | Chang | |
| 6,064,756 A | 5/2000 | Beaty et al. | |
| 6,064,757 A | 5/2000 | Beaty et al. | |
| 6,068,727 A | 5/2000 | Weaver et al. | |
| 6,072,898 A | 6/2000 | Beaty et al. | |
| 6,115,909 A | 9/2000 | Miller | |
| 6,389,688 B1 * | 5/2002 | Srivastava et al. ............ | 29/740 |
| 6,711,810 B2 | 3/2004 | Buley et al. | |
| 6,924,174 B2 * | 8/2005 | Koizumi et al. ............ | 438/108 |
| 7,430,798 B2 | 10/2008 | Koizumi et al. | |
| 8,176,624 B2 * | 5/2012 | Doany et al. ............... | 29/740 |
| 8,265,432 B2 * | 9/2012 | Doany et al. ............... | 385/14 |

* cited by examiner

*Primary Examiner* — Minh Trinh
(74) *Attorney, Agent, or Firm* — Scully, Scott, Murphy & Presser, P.C.; Daniel P. Morris, Esq.

(57) ABSTRACT

An apparatus and method for aligning one or more components while attaching the component to a substrate. The component is positioned over the substrate. An alignment tool is attachable to the component. The alignment tool includes a tool alignment element, an optical tool, and a substrate alignment element attached to the substrate. The tool alignment element aligns with the substrate alignment element such that the components are positioned at specified locations on the substrate for attachment to the substrate. Further, in the method according to the disclosure, the tool alignment element aligns with the substrate alignment element to position one or more components at a specified location on the substrate.

9 Claims, 3 Drawing Sheets

OPTICAL ALIGNMENT MODULE UTILIZING TRANSPARENT RETICLE TO FACILITATE TOOL CALIBRATION DURING HIGH TEMPERATURE PROCESS

RELATED APPLICATIONS

This application is a divisional of U.S. Ser. No. 12/623,836, filed Nov. 23, 2009, the entire contents of which are incorporated herein by reference.

BACKGROUND

The present invention relates to an alignment apparatus for facilitating tool calibration, and more specifically, the present invention relates to an alignment apparatus for facilitating tool calibration during high temperature processes.

Current alignment tools, for example, an alignment (or rework) tool used in a ball grid array (BGA) rework, may use an optical alignment of a component or module to a substrate. The substrate may be large substrates, for example, 35 inches×20 inches, or smaller. A typical placement accuracy for placement of a component on a substrate for current tools is about 25 microns. Heretofore, efforts to achieve greater accuracy in placement of a component on a substrate has been unsuccessful.

In one example, during semiconductor processing at high temperatures, in a solder reflow cycle, the temperature of the substrate may be greater than 200 degrees C. The reflow cycle causes solder balls attaching the component to the substrate to liquefy resulting in placement alignment being shifted. Thus, another problem with current alignment tools is that the placement of the component(s) may not be maintained. Further, certain applications need greater accuracy in placement alignment, and the alignment must also be maintained during high temperature processing. Current alignment/calibration procedures, which may be prescribed by the tool manufacturer, uses a calibration target which the tool uses to automatically calibrate the placement points for the entire working area. However, fine or slight alignment of components using the procedure falls short of desired specifications.

There is therefore a need for an improved alignment/calibration tool and method for achieving specified component alignment. It is further desirable for the alignment tool and method to provide the specified component alignment during a high temperature process. Additionally, there is need for the alignment tool and method to provide the specified component alignment during a high temperature process and maintaining the alignment of the component during a reflow cycle.

BRIEF SUMMARY

In an aspect of the present invention, an apparatus for aligning a component for attaching the component to a substrate comprises an alignment tool attachable to at least one component for attaching to a substrate. A tool alignment element is part of the tool, and a substrate alignment element is attachable to a substrate positioned beneath the alignment tool. The tool alignment element aligns with the substrate alignment element such that the component is positioned at a specified location on the substrate for attachment to the substrate.

In a related aspect, the apparatus further comprises a plurality of connection elements on the component, and a plurality of conductive pads on the substrate for mating with the connection elements on the component in mating relation when the component is positioned at the specified location. The component may be attached to the substrate using solder forming a solder ball. In a related aspect, the solder ball aligns with the substrate pad by greater than one quarter of a diameter of the solder ball connecting to the substrate pad. In another related aspect, the position of the component is maintained during a solder reflow cycle. The alignment tool may be attachable to two components, and the tool alignment element aligns with the substrate alignment element such that the components are positioned at specified locations on the substrate for attachment to the substrate. The apparatus may further include an optical tool being part of the alignment tool and the tool alignment element being transparent, wherein the optical tool aligns the tool alignment element and the substrate alignment element along an optical axis. The optical tool may align the tool alignment element and the substrate alignment element using a reticle on the substrate alignment element.

In another aspect of the invention, a method for aligning a component for attachment to a substrate comprises: attaching an alignment tool to at least one component; positioning the component on a substrate; aligning the component on the substrate using a tool alignment element being part of the alignment tool and a substrate alignment element attachable to the substrate; and aligning the component on the substrate such that the component is positioned at a specified location on the substrate for attachment to the substrate.

In a related aspect, the method further comprises: mating a plurality of connection elements on the component with a plurality of pads on the substrate when the component is positioned at the specified location. The method may further comprise forming a solder ball for attaching the component to the substrate. In a related aspect, the method further comprises: aligning the solder ball with the substrate pad for connecting the solder ball to the substrate pad, the solder ball being on the substrate pad by greater than one quarter of a diameter of the solder ball. The method may further comprise maintaining the positioning of the component on the substrate during a solder reflow cycle. The method may further comprise: attaching the alignment tool to two components; and aligning the tool alignment element with the substrate alignment element such that the components are positioned at specified locations on the substrate for attachment to the substrate.

In another aspect of the invention, an alignment system for aligning and attaching a component to a substrate comprises an alignment tool attachable to two components for attaching to a substrate, wherein each of the components includes a plurality of connection elements. A tool alignment element is part of the tool, and a substrate alignment element is attachable to a substrate positioned beneath the alignment tool. The tool alignment element aligns with the substrate alignment element such that the components are positioned at specified locations on the substrate for attachment to the substrate. A plurality of conductive pads on the substrate are for mating with the connection elements on the components in mating relation when the components are positioned at their respective specified locations.

In a related aspect, the components are attached to the substrate using solder forming a solder ball. The solder ball may align with the substrate pad by greater than one quarter of a diameter of the solder ball connecting to the substrate pad. The positions of the components may be maintained during a solder reflow cycle. The system may further include an optical tool being part of the alignment tool and the tool alignment element being transparent, wherein the optical tool aligns the tool alignment element and the substrate alignment element along an optical axis. The optical tool may align the tool alignment element and the substrate alignment element using a reticle on the substrate alignment element.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings, in which.

DETAILED DESCRIPTION

Figure 2:
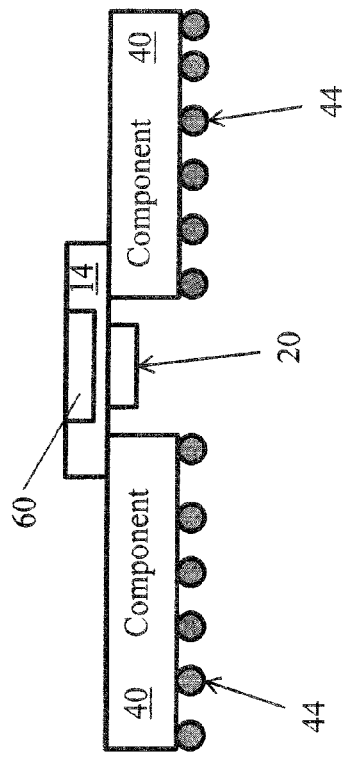
FIG. 2 is a side elevational block diagram of the alignment tool shown in FIG. 1 attached to components.
Figure 3:
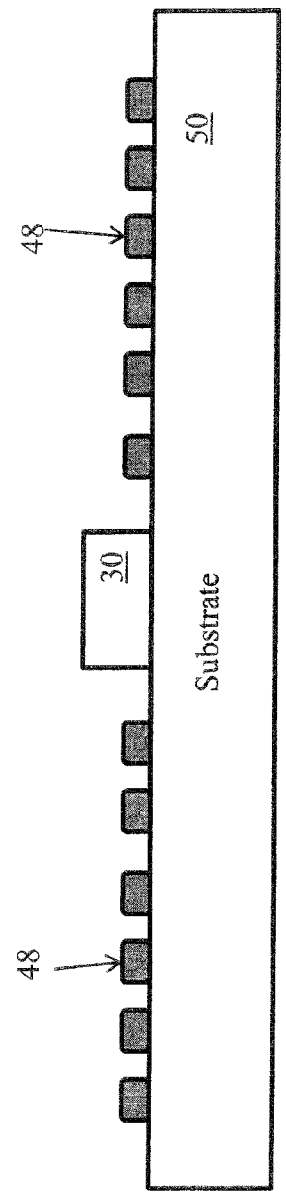
FIG. 3 is a side elevational block diagram of a substrate including an attached substarte alignment element of the alignment tool shown in FIG. 1.
Figure 1:
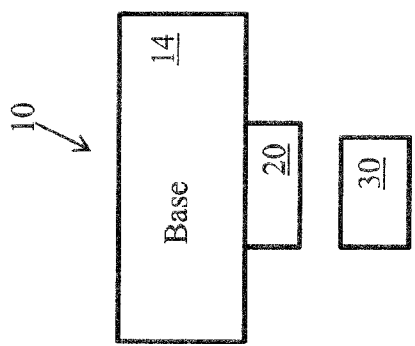
FIG. 1 is a block diagram of an alignment tool according to an embodiment of the invention.
Figure 4:
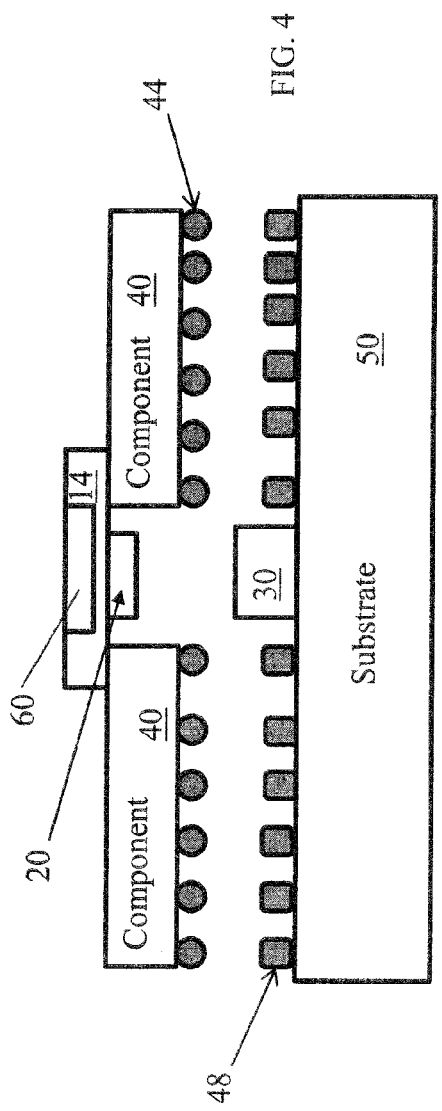
FIG. 4 is a side elevational block diagram of the components of FIG. 2 positioned over the substrate of FIG. 3.
Figure 5:
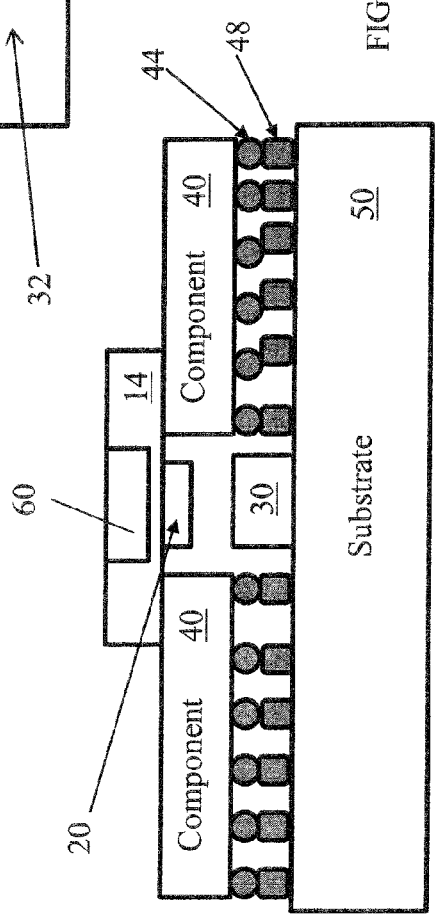
FIG. 5 is a side elevational block diagram of the components and subatrate shown in FIG. 4 in mating relation.

Referring to FIGS. 1-4, an illustrative embodiment of an apparatus for aligning components for attachment to a substrate according to the present invention includes an alignment tool 10 and a substrate alignment element 30. The alignment tool 10 (or alignment device) includes a base 14 and a tool alignment element 20 attached to the base 14 (FIG. 1). Further, the alignment tool 10 includes the substrate alignment element 30 for attachment to a substrate 50, shown in FIG. 3. The base 14 of the alignment tool 10 is attached to two components embodied as electrical components 40 for attaching to the substrate 50. The components 40 may be, for example, semiconductor chips or die, or other components used in semiconductor manufacturer. Additionally, in an alternative embodiment, one component may be attached to the base and the tool alignment element 20 used to position the one component on the substrate 50. Referring to FIG. 3, the substrate alignment element 30 is attached to the substrate 50 and positioned beneath the tool alignment element 20. The tool alignment element 20 aligns with the substrate alignment element 30 such that the components 40 are positioned (FIG. 4) at a specified location on the substrate for attachment to the substrate 50 (FIG. 5). The base 14 and the alignment tool 20 are transparent to provide an optical axis therethrough for alignment with the substrate alignment element 30. In the embodiment of the present invention, an optical tool 60 in the base 14 of the alignment tool 10, provides alignment between the tool alignment element 20 and the substrate alignment element 30. The optical tool 60 maintains a visual alignment using the alignment element 20 and the substrate alignment element 30 before and after high temperature processing. The optical tool 60 is composed of dynamic clear crystal glass 100 μm thick with dimensions of 4 mm×8 mm. On the glass substrate is a gold and chromium pattern, which is deposited on opposite sides of the substrate to differentiate the calibration effect. A mirror pattern is replicated on the alignment element 30 to check for alignment accuracy. Thereby, the optical tool 60 maintains the alignment of the components 40 with the substrate 50.

The components 40 include a plurality of connection elements embodied as solder balls 44. The solder balls 44 align with the conductive pads embodied as solder pads 48 on the substrate 50 for mating with the solder balls 44 as shown in FIG. 5. The solder balls 44 on the components 40 mate with solder pads 48 on the substrate 50. Using the optical tool 60, described above, the solder balls 44 align with the substrate 50 solder pad 48 by greater than one quarter of the diameter of the solder ball connecting with the solder pad 48.

Figure 6:
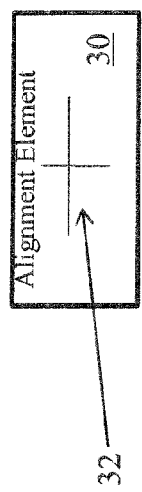
FIG. 6 is a top view of the substrate alignment element shown in FIGS. 1-5 depicting a reticle.

The optical tool 60 of the alignment tool 10 can use lines, cross-patterns, circles, reticle 32 (FIG. 6) or a Vernier scale with top and bottom matching or complimentary patterns to align the tool alignment element 20 with the substrate alignment element 30, and thus the components 40 with the substrate 50. In the present invention, the component 40 positioning is maintained during processing which may include high temperatures, for example a solder reflow cycle having temperatures of over 200 degrees C. The procedure is repeated to achieve the desired accuracy of less than 10 microns.

In operation, referring to FIGS. 1-4, a method according to the present invention, using the alignment tool 10, for aligning components for attachment to a substrate, includes, attaching the base 14 of the alignment tool 10 to components 40, and attaching the substrate alignment element 30 to the substrate 50. The substrate alignment element 30 is positioned beneath the tool alignment element 20 such that the optical tool 60 can align the tool alignment element 20 with the substrate alignment element 30 resulting in the components 40 being positioned (FIGS. 4 and 5) at a specified location on the substrate 50 for attachment to the substrate 50. The optical tool 60 maintains the alignment of the components 40 with the substrate 50 during high heat processing.

More specifically, for example, during a high temperature solder reflow process, the solder balls 44 are aligned with the solder pads 48 on the substrate 50 for mating with the solder balls 44 as shown in FIG. 5. The optical tool 60 aligns the components 40 with the substrate 50 such that the solder balls 44 on the components 40 mate with solder pads 48 on the substrate 50. The optical tool 60 maintains the alignment of the components 40 with the substrate 50 such that the solder balls 44 align with the solder pads 48 by greater than one quarter of the diameter of the solder balls 44 connecting with the solder pads 48. Thus, during processing which includes high temperatures, for example, the solder reflow cycle having temperatures of over 200 degrees C., the alignment of the component 40 on the substrate 50 is maintained using by the optical tool 60 maintaining the alignment of the alignment tool 20 with the alignment element 30 on the substrate 50.

Figure 7:
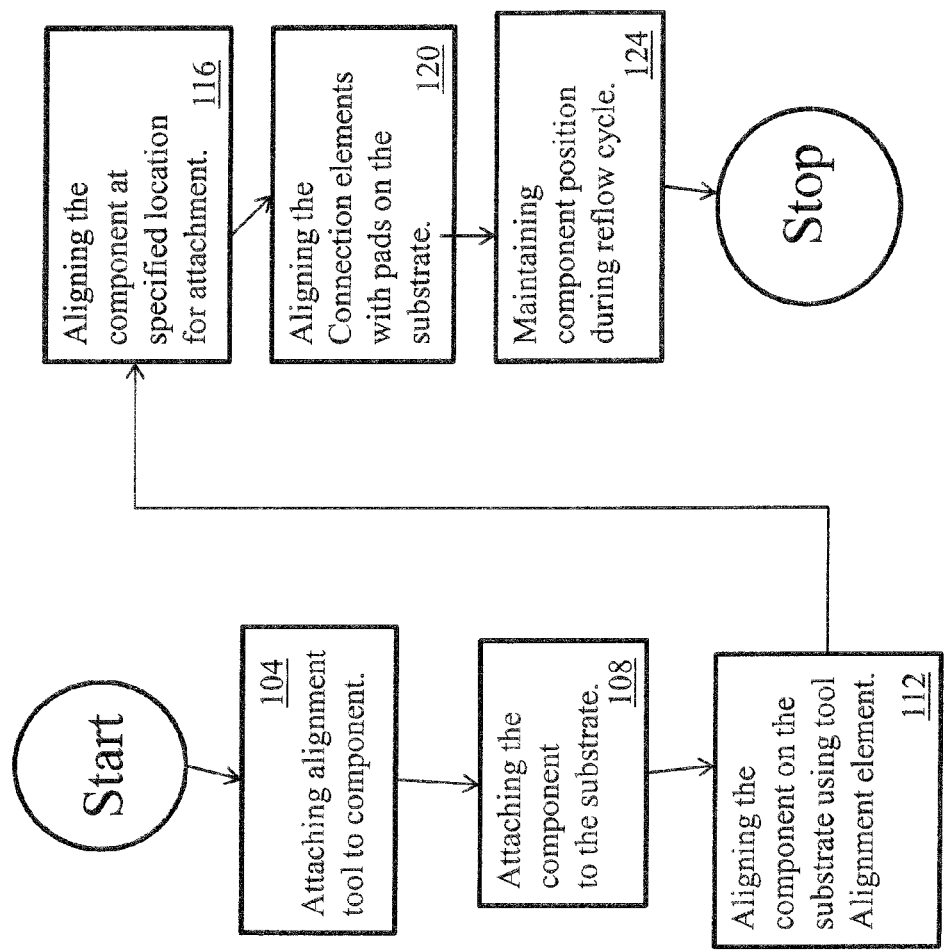
FIG. 7 is a flow chart of an illustrative embodiment of a method according to the present invention for aligning a component on a substrate.

Referring to FIG. 7 a flow chart according to the present invention depicts a method 100 for aligning the components 40 (FIGS. 4 and 5) for attachment to the substrate 50. Step 104 includes attaching an alignment tool 14 to at least one component 40. Next, the component 40 is attached to the substrate 50 in step 108. Step 112 includes aligning the component 40 on the substrate 50 using the tool alignment element 20 which is part of the alignment tool 14 and using the substrate alignment element 20 attachable to the substrate 50. Step 116 includes aligning the component on the substrate such that the component is positioned at a specified location on the substrate for attachment to the substrate. The alignment includes mating the plurality of connection elements 44 on the component 40 with the plurality of pads 48 on the substrate 50 in step 120. The method 100 further includes, maintaining the positioning of the component on the substrate during a solder reflow cycle, in step 124.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for aligning a component for attachment to a substrate, comprising:
    attaching an alignment tool to at least one component, the alignment tool having an optical tool element and a transparent tool alignment element;
    positioning the component on a substrate;
    vertically aligning the component on the substrate using the transparent tool alignment element and a substrate alignment element attachable to the substrate, said optical tool element providing a visual alignment between the transparent tool alignment element and the substrate alignment element along an optical axis; and
    aligning the component on the substrate such that the component is positioned at a specified location on the substrate for attachment to the substrate.

2. The method of claim 1, further comprising:
    mating a plurality of connection elements on the component with a plurality of pads on the substrate when the component is positioned at the specified location.

3. The method of claim 1, further comprising:
    forming a solder ball for attaching the component to the substrate.

4. The method of claim 3, further comprising:
    aligning the solder ball with the substrate pad for connecting the solder ball to the substrate pad, the solder ball being positioned on the substrate pad such that a degree of offset of the solder ball on the substrate pad does not exceed a distance defined by one quarter of a diameter of the solder ball.

5. The method of claim 3, further comprising:
    maintaining the positioning of the component on the substrate during a solder reflow cycle.

6. The method of claim 1, further comprising:
    attaching the alignment tool to two components; and
    aligning the tool alignment element with the substrate alignment element such that the components are positioned at specified locations on the substrate for attachment to the substrate.

7. The method of claim 1, further comprising:
    maintaining, by said optical tool element, a visual alignment between the transparent tool alignment element and the substrate alignment element along an optical axis before and after a high temperature processing.

8. The method of claim 7, wherein said maintaining, by said optical tool element, a visual alignment between the transparent tool alignment element and the substrate alignment element comprises: using one or more of: lines, cross-patterns, circles, a reticle or a Vernier scale with top and bottom matching or complimentary patterns for said alignment.

9. The method of claim 1, wherein said component includes a plurality of connection elements and said substrate includes a plurality of pads, said aligning the component on the substrate comprising:
    mating said plurality of connection elements on the component with the plurality of pads on the substrate.

* * * * *